United States Patent
Hiraoka et al.

(10) Patent No.: US 12,219,688 B2
(45) Date of Patent: Feb. 4, 2025

(54) DIELECTRIC BARRIER PLASMA GENERATOR AND PLASMA DISCHARGE STARTING METHOD FOR DIELECTRIC BARRIER PLASMA GENERATOR

(71) Applicant: Ushio Denki Kabushiki Kaisha, Tokyo (JP)

(72) Inventors: Takahiro Hiraoka, Tokyo (JP); Kensuke Nakamura, Tokyo (JP); Takanori Samejima, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 85 days.

(21) Appl. No.: 17/800,881

(22) PCT Filed: Jan. 18, 2021

(86) PCT No.: PCT/JP2021/001448
§ 371 (c)(1),
(2) Date: Aug. 18, 2022

(87) PCT Pub. No.: WO2021/181879
PCT Pub. Date: Sep. 16, 2021

(65) Prior Publication Data
US 2023/0100544 A1    Mar. 30, 2023

(30) Foreign Application Priority Data

Mar. 13, 2020 (JP) .................. 2020-043777

(51) Int. Cl.
*H05H 1/00* (2006.01)
*H05H 1/24* (2006.01)

(52) U.S. Cl.
CPC .......... *H05H 1/2406* (2013.01); *H05H 1/245* (2021.05)

(58) Field of Classification Search
CPC ... H01L 21/3065; H01L 21/31; C23C 16/513; H05H 1/246; H05H 1/245; H05H 1/2406
See application file for complete search history.

(56) References Cited

U.S. PATENT DOCUMENTS

| | | | | |
|---|---|---|---|---|
| 2011/0089834 A1* | 4/2011 | McGeoch | ................ | H05H 1/06 315/111.41 |
| 2011/0175531 A1* | 7/2011 | Urdahl | ..................... | H05H 1/46 315/111.21 |

(Continued)

FOREIGN PATENT DOCUMENTS

| | | |
|---|---|---|
| EP | 3264866 A1 | 1/2018 |
| JP | 2007-0299720 A | 11/2007 |

(Continued)

OTHER PUBLICATIONS

Supplementary European Search Report (SESR) Mailed On Jul. 18, 2023 For Corresponding EP21768415 Based Upon JP2020-043777 and PCT/JP2021001448, From Which the Current US Application Claims Priority.

(Continued)

*Primary Examiner* — Tuan T Lam
(74) *Attorney, Agent, or Firm* — Yoshida & Associates LLC; Ken I Yoshida

(57) ABSTRACT

A dielectric barrier plasma generator includes: a dielectric substrate, a high-voltage electrode provided on a first surface of the dielectric substrate, a low-voltage electrode provided to face a second surface of the dielectric substrate, a power introduction section provided at a first end of the high-voltage electrode, a gas channel formed from a first end to a second end thereof between the dielectric substrate and the low-voltage electrode to allow gas to flow from the first end of the gas channel to the second end thereof, and a blowout outlet formed at the second end of the gas channel to blow out the gas that has flown through the gas channel and (Continued)

plasma that has been generated in the gas channel. The dielectric substrate includes a portion having a thickness being thinner when being closer to the blowout outlet.

15 Claims, 9 Drawing Sheets

(56) References Cited

U.S. PATENT DOCUMENTS

| | | | | |
|---|---|---|---|---|
| 2013/0119264 | A1* | 5/2013 | Yagi | H01T 23/00 |
| | | | | 250/423 R |
| 2013/0161507 | A1 | 6/2013 | Nishimura et al. | |
| 2014/0224643 | A1 | 8/2014 | Collins et al. | |
| 2014/0225502 | A1* | 8/2014 | Kang | C23C 16/452 |
| | | | | 315/111.21 |
| 2020/0205277 | A1* | 6/2020 | Kim | H01J 37/32449 |
| 2022/0001405 | A1* | 1/2022 | Inagaki | B05B 5/03 |
| 2022/0059322 | A1* | 2/2022 | Arita | H01J 37/32541 |
| 2023/0013017 | A1* | 1/2023 | Arita | H01J 37/32348 |

FOREIGN PATENT DOCUMENTS

| | | | | |
|---|---|---|---|---|
| JP | 2008-282784 A | | 11/2008 | |
| JP | 2010-9890 A | | 1/2010 | |
| KR | 101843770 B1 | | 8/2017 | |
| WO | WO-2015030191 A1 | * | 3/2015 | ........... C23C 16/455 |
| WO | WO-2023037583 A1 | * | 3/2023 | |

OTHER PUBLICATIONS

Request for the Submission of an Opinion (KR-OA), English Translation, Mailed On May 16, 2024 For KR 10-2022-7020879 Based Upon JP2020-043777 and PCT/JP2021001448, From Which the Current US Application Claims Priority.

Notice of Reasons for Refusal (TW-OA) English Translation, Mailed On May 15, 2024 For TW App No. 110100033 Based Upon JP2020-043777 and PCT/JP2021001448, From Which the Current US Application Claims Priority.

* cited by examiner (Unit: mm)

DIELECTRIC BARRIER PLASMA GENERATOR AND PLASMA DISCHARGE STARTING METHOD FOR DIELECTRIC BARRIER PLASMA GENERATOR

TECHNICAL FIELD

The present invention relates to a dielectric barrier plasma generator and a plasma discharge starting method for the dielectric barrier plasma generator.

BACKGROUND ART

Plasma generators find applications in manufacturing processes for plastics, paper, fibers, semiconductors, liquid crystals, films, and other materials. For example, irradiating these materials with plasma generated by plasma generators makes it possible to undergo surface treatment for improving hydrophilicity, adhesiveness, print adhesion, or the like on the surface to be irradiated, to remove organic matter from the surface to be irradiated and clean the surface thereof, and to form an oxide film on the surface to be irradiated.

FIG. 18 is a schematic diagram of a conventional plasma generator. The patent document 1 discloses a plasma generator 200 that is provided with a pair of electrodes 201 and 201 facing each other, a facing surface 202 of one electrode 201 being inclined in a direction opposite to a direction in which a facing surface 202 of the other electrode 201 is inclined.

In the plasma generator 200, by applying a voltage between the electrodes 201 and 201 while introducing a gas for generating plasma G through the top opening, a number of streamer discharge S is generated in an opposing region 202. Here, the gas for generating plasma G is introduced from a gas introduction hole 223 through an orifice 225 of a jetting plate 224 into an opposing region 202, hence the gas for generating plasma G is accelerated by the orifice 225 to jet into the opposing region 202 at high speed. This jet causes turbulence in the gas for generating plasma G, which in turn causes the streamer discharge S to be diffused and dispersed in the opposing region 202. Then, the dispersed streamer discharge S generates plasma P substantially uniformly throughout the entire opposing region 202, and this plasma P is blown out from the bottom opening of the opposing region 202 into a processing space 205 as plasma jet, spraying onto an object to be treated H. Patent Document 1 discloses that adopting the above configuration makes it possible to generate uniform plasma. Meanwhile, an electrode layer is designed to be thick such that an electrode section holds a dielectric body to secure the overall strength. In such a case, the dielectric body is very susceptible to cracking due to a difference in linear expansion coefficient between dielectric material and metal constituting an electrode, which poses a problem from a viewpoint of a service life. Typically, the dielectric body is made of ceramic materials, and the electrode is made of metal. Using the dielectric body having a thin wall causes a mechanical strain to occur due to the difference in linear expansion between ceramics and metal. This mechanical strain results in damaging the thin ceramics. A method to address this drawback includes that the thickness of the ceramics increases to secure its strength. However, when the thickness of the dielectric body increases, the dielectric loss also increases, which poses a problem of sacrificing the efficiency of plasma generation.

CITATION LIST

Patent Documents

Patent Document 1: JP-A-2010-009890

SUMMARY OF INVENTION

Technical Problem

The plasma generator 200, which is disclosed in Patent Document 1, attempts to generate plasma P approximately uniformly over the entire opposing region 202 by generating turbulence. However, in this method in which such a configuration of electrodes generates plasma over the entire opposing region 202, the plasma blown out of the blowout outlet is not sufficiently uniform. For example, the plasma generated at a position far from the blowout outlet of the opposing region 202 disappears while traveling to the blowout outlet. Hence, the plasma fails to uniformly jet from the entire region of the blowout outlet. In addition, the lifetime of the active species that has been generated in the plasma is short, thus the plasma generated at a position far from the blowout outlet of the opposing region 202, i.e., far from the object to be treated, disappears while traveling to the blowout outlet, preventing plasma from jetting efficiently.

The present invention was made in view of the above-described problems. It is an object of the present invention to provide a dielectric barrier plasma generator capable of efficiently generating plasma in the vicinity of a blowout outlet and uniformly ejecting plasma from the entire region of the blowout outlet. It is also an object of the present invention to provide a plasma discharge starting method in the dielectric barrier plasma generator.

Solution to Problem

A dielectric barrier plasma generator according to the present invention includes:
  a dielectric substrate;
  a high-voltage electrode provided on a first surface of the dielectric substrate;
  a low-voltage electrode provided to face a second surface of the dielectric substrate;
  a power introduction section provided at a first end of the high-voltage electrode;
  a gas channel formed from a first end to a second end thereof between the dielectric substrate and the low-voltage electrode to allow gas to flow from the first end of the gas channel to the second end thereof; and
  a blowout outlet formed at the second end of the gas channel to blow out the gas that has flown through the gas channel and plasma that has been generated in the gas channel,
  the dielectric substrate includes a portion having a thickness being thinner when being closer to the blowout outlet.

In the dielectric barrier plasma generator according to the present invention, since the dielectric substrate includes a portion having a thickness being thinner when being closer to the blowout outlet, the portion has a larger capacitance when being closer to the blowout outlet. Discharge occurs at a place where the voltage applied to gas exceeds its dielectric breakdown voltage. Hence, setting the slope of the thickness of the dielectric substrate in a manner in which the voltage applied to gas exceeds its dielectric breakdown voltage in the vicinity of the blowout outlet enables plasma to be generated in the vicinity of the blowout outlet. As a result, this configuration is capable of uniformly ejecting plasma from the entire region of the blowout outlet. In addition, generating plasma in the vicinity of the blowout outlet improves the plasma generation efficiency.

The dielectric barrier plasma generator of the present invention fails to use microwaves, thus eliminating the need to conduct impedance matching or the like for microwave transmission. Hence, no restriction is applied to the shape of the dielectric substrate, high-voltage electrode, and blowout outlet. In addition, failing to use microwaves eliminates the need to take countermeasures against the leakage of electromagnetic waves. Meanwhile, microwave-induced plasma is generated at a belly of the standing waves where the electric field strength is strong with high density. The standing waves are generated not only in an input direction of microwave but also in a direction orthogonal to the input direction. Hence, when the blowout outlet is viewed from the front, the areas of plasma with high density and the areas of plasma with low density occur alternately. This phenomenon makes the plasma generated by microwaves difficult to uniformly jet from the entire region of the blowout outlet. In contrast, the dielectric barrier plasma generator of the present invention is of a dielectric barrier type. Since discharge occurs where the voltage applied to gas exceeds its dielectric breakdown voltage, setting the slope of the thickness of the dielectric substrate in a manner in which the voltage applied to gas exceeds its dielectric breakdown voltage in the vicinity of the blowout outlet enables plasma to uniformly jet from the entire region of the blowout outlet.

The above configuration may preferably include a power supply unit having an applied voltage of 3 kV to 20 kV and a frequency of 20 kHz to 150 kHz.

Being provided with the power supply unit as described above, the dielectric barrier plasma generator of a dielectric barrier type is capable of appropriately generating plasma with the dielectric barrier method. The reasons for setting an upper limit of 150 kHz are that the frequency is determined with the consideration of the plasma irradiation length of the dielectric barrier plasma generator, and that the frequency detected with the noise terminal voltage conformed with the Electromagnetic Compatibility (EMC) standard is 150 kHz or higher.

In the above configuration, the gas channel may include a portion in which a gap between the dielectric substrate and the low-voltage electrode is narrower when being closer to the blowout outlet.

When the gas channel includes a portion in which the gap between the dielectric substrate and the low-voltage electrode is narrower when being closer to the blowout outlet, the configuration is capable of increasing the amount of variation in capacitance.

The above configuration may include a protective layer in a vicinity of the blowout outlet and on the low-voltage electrode so as to prevent a material constituting the low-voltage electrode from dispersing.

Providing the protective layer in the vicinity of the area at which plasma is generated, in other words, in the vicinity of the blowout outlet and on the low-voltage electrode suppresses the material constituting the low-voltage electrode from evaporating and diffusing, preventing the contamination of the object to be irradiated.

In the above configuration, the dielectric substrate may preferably be made of a material including alumina or aluminum nitride.

Alumina and aluminum nitride have relatively low relative permittivity and relatively high strength and hardness. Hence, the dielectric substrate made of a material including alumina or aluminum nitride increases the amount of plasma generated per unit power. In addition, this configuration reduces a risk of damage even if the dielectric substrate is made thinner. Among these, aluminum nitride has good thermal conductivity and can efficiently dissipate heat from the dielectric substrate. Hence, the dielectric substrate made of aluminum nitride reduces the temperature of the high-voltage electrode, suppressing interface stress associated with thermal expansion between the substrate and the high-voltage electrode. Therefore, this configuration extends the service life of the present device.

In the above configuration, the high-voltage electrode may include a foil metal.

In the above configuration, the high-voltage electrode may include a sintered body containing conductive metal. The sintered body containing the conductive metal may be formed by printing a metal paste. This configuration eliminates the need for using an adhesive when forming the high-voltage electrode on the dielectric substrate.

In the above configuration, the high-voltage electrode may be formed by plating, vapor deposition, sputtering, or thermal spraying. This configuration eliminates the need for using an adhesive when forming the high-voltage electrode on the dielectric substrate.

The above configuration may include an auxiliary starting member that is disposed in the vicinity of the blowout outlet and on the second surface of the dielectric substrate.

The discharge using the dielectric barrier method has properties in which high power is needed at the time of discharge start and the discharge can be maintained with lower power after its lighting. Hence, it is common to adopt a method in which high power is applied at the start of lighting. However, this method needs a power supply unit capable of outputting high power, or an external trigger electrode additionally installed near the discharge space, which may cause the device to become larger. Starting plasma discharge requires a certain amount of initial electrons to be present at an area in which the plasma is made to be generated. Hence, when an auxiliary starting member is disposed in the vicinity of the blowout outlet, where plasma is made to be generated, and on the second surface of the dielectric substrate, the initial electrons will be supplied to the space in the vicinity of the blowout outlet and on the dielectric substrate in the initial start. This configuration eliminates the need for a power supply unit having large power supply capacity and a starter circuit device, making it possible to provide a compact and inexpensive plasma generator.

The above configuration may preferably include at least two gas introduction paths through which gas is introduced into the gas channel.

The above configuration including the at least two gas introduction paths makes the gas flow in the gas channel more laminar flow because the gas is introduced into the gas channel from at least two locations.

The above configuration may include a light-shielding member at the blowout outlet.

The above configuration including the light-shielding member at the blowout outlet prevents light due to the discharge from radiating the object to be irradiated.

The above configuration may include a gas buffer substrate having a cavity thereinside, the gas buffer substrate being stacked on a surface of the low-voltage electrode, the surface being opposite to a surface facing the dielectric substrate.

This configuration allows the gas released from a gas delivery device to be stored in the cavity of the gas buffer substrate and then to flow into the gas channel through the plurality of gas introduction paths. This enables the gas that has flown into the gas channels to evenly flow out of the blowout outlet without disturbing its flow.

In the above configuration, a predetermined clearance may be provided between the second end of the high-voltage electrode and a surface on which the blowout outlet is formed.

In the vicinity of the blowout outlet, direct discharge may occur between the high-voltage electrode and the low-voltage electrode without passing through the dielectric substrate. Such discharge damages the high-voltage electrode, dielectric substrate, and low-voltage electrode, thereby mixing the materials constituting these components into the plasma as impurities. From a standpoint of discharge efficiency, it is advantageous to mount the high-voltage electrode at the front edge of the blowout outlet. However, this configuration allows the distance between the high-voltage electrode and the low-voltage electrode to become significantly shorter, causing creeping discharge on the dielectric substrate. Once the discharge occurs, it does not form dielectric barrier discharge, but moves on to direct discharge, thus an excessive discharge current flows, causing damage to the electrodes and eventually damage to the power supply unit. Hence, the configuration in which a predetermined clearance is provided between the second end of the high-voltage electrode and the surface on which the blowout outlet is formed prevents the direct discharge between the high-voltage electrode and the low-voltage electrode, and enables the discharge between the high-voltage electrode and the low-voltage electrode through the dielectric substrate, thereby preventing damage to the high-voltage electrode, dielectric substrate, and low-voltage electrode. Therefore, this configuration makes it possible to prevent the materials constituting these components from being mixed into the plasma as impurities.

In the above configuration, the portion of the dielectric substrate having a thickness being thinner when being closer to the blowout outlet may have a staircase shape.

Ceramics are susceptible to cracking and poses a problem of lacking mechanical strength. Hence, the configuration in which the portion of the dielectric substrate having a thickness being thinner when being closer to the blowout outlet may have a staircase shape maintains mechanical strength.

A plasma discharge starting method according to the present invention is a plasma discharge starting method for a dielectric barrier plasma generator, the dielectric barrier plasma generator includes:

a dielectric substrate;

a high-voltage electrode provided on a first surface of the dielectric substrate;

a low-voltage electrode provided to face a second surface of the dielectric substrate;

a power introduction section provided at a first end of the high-voltage electrode;

a gas channel formed from a first end to a second end thereof between the dielectric substrate and the low-voltage electrode to allow gas to flow from the first end of the gas channel to the second end thereof; and a blowout outlet formed at the second end of the gas channel to blow out the gas that has flown through the gas channel and the plasma that has been generated in the gas channel, the dielectric substrate that includes a portion having a thickness being thinner when being closer to the blowout outlet, the plasma discharge starting method includes:

a process A of introducing at least one type of starting gas selected from the group consisting of He, Ne, and Ar into the gas channel to generate plasma at a time of starting; and a process B of introducing a gas for generating plasma into the gas channel after the process A.

In the plasma discharge starting method of the present invention, the plasma is generated by introducing at least one type of starting gas selected from the group consisting of He, Ne, and Ar into the gas channel to generate plasma at the time of starting. After the starting, the gas for generating plasma is introduced into the gas channel. Hence, this method is capable of starting discharge even though the gas for generating plasma is a gas that is less likely to undergo plasma discharge.

Advantageous Effects of Invention

The present invention provides a dielectric barrier plasma generator capable of efficiently and uniformly ejecting plasma from the entire region of the blowout outlet. The present invention also provides a plasma discharge starting method of the dielectric barrier plasma generator.

DESCRIPTION OF EMBODIMENTS

Hereinafter, embodiments of a dielectric barrier plasma generator according to the present embodiment will be described with reference to the drawings.

First Embodiment

Figure 1:
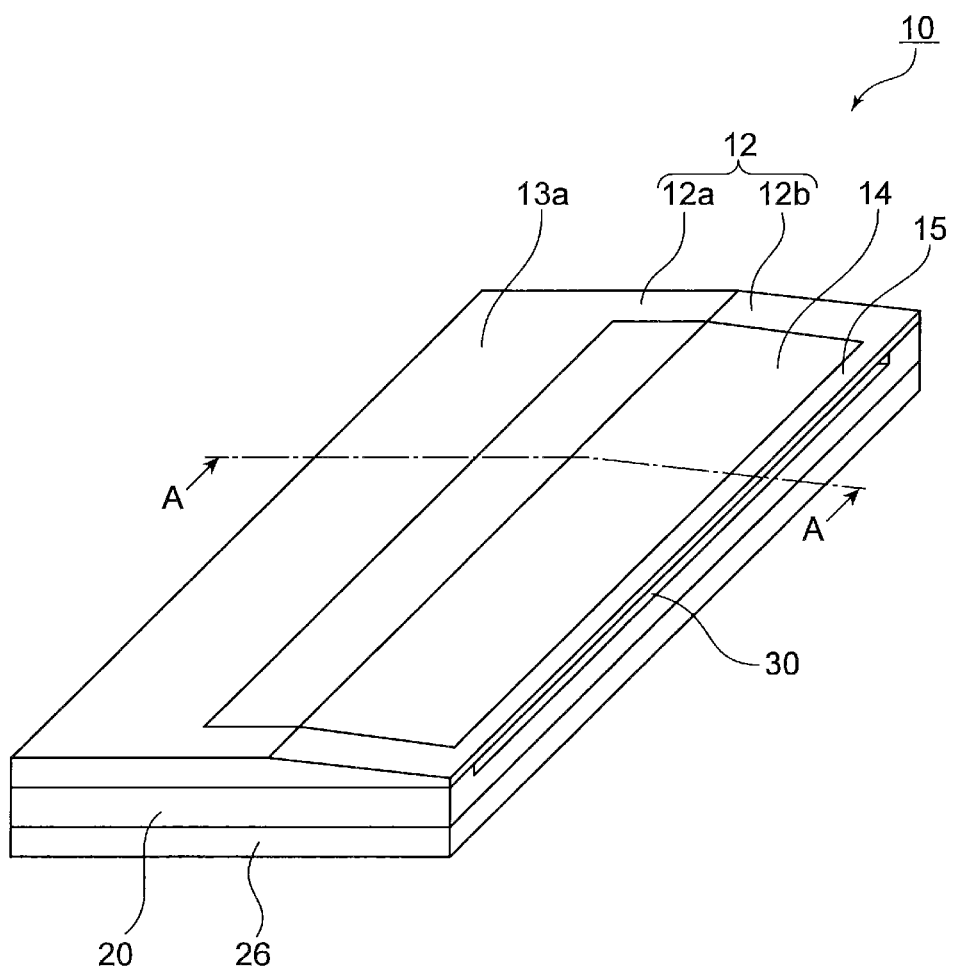
FIG. 1 is a perspective view schematically illustrating a dielectric barrier plasma generator according to a first embodiment.
Figure 2:
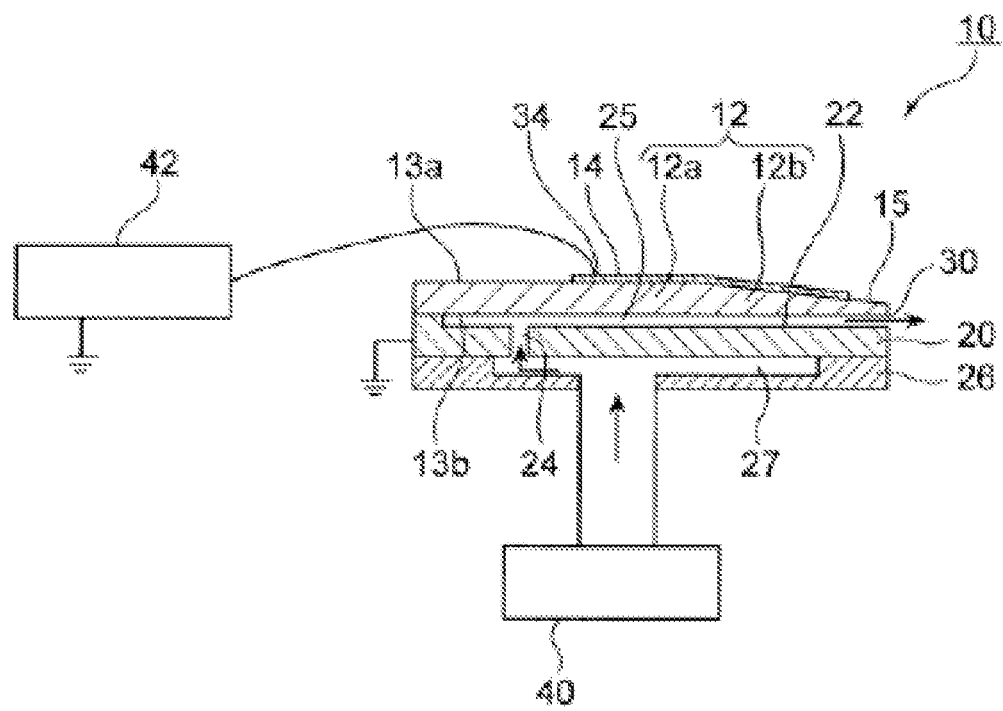
FIG. 2 is a cross-sectional view of the dielectric barrier plasma generator taken along the line A-A shown in FIG. 1.
Figure 3:
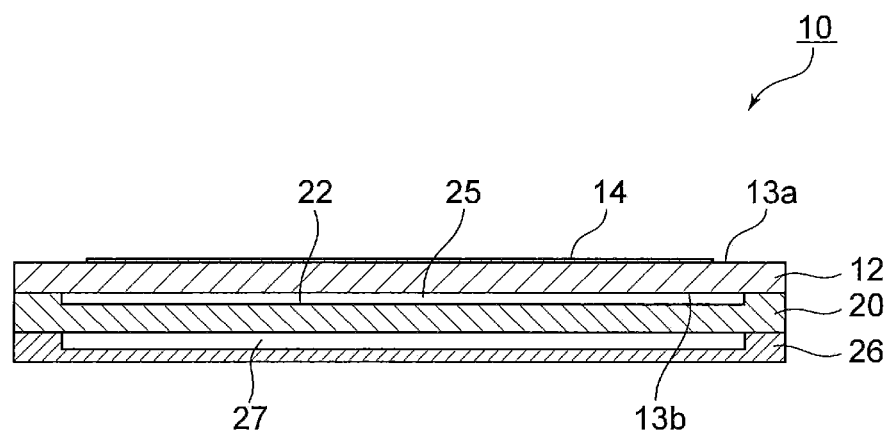
FIG. 3 is a cross-sectional view of the dielectric barrier plasma generator taken along a line orthogonal to the line A-A shown in FIG. 1.
Figure 4:
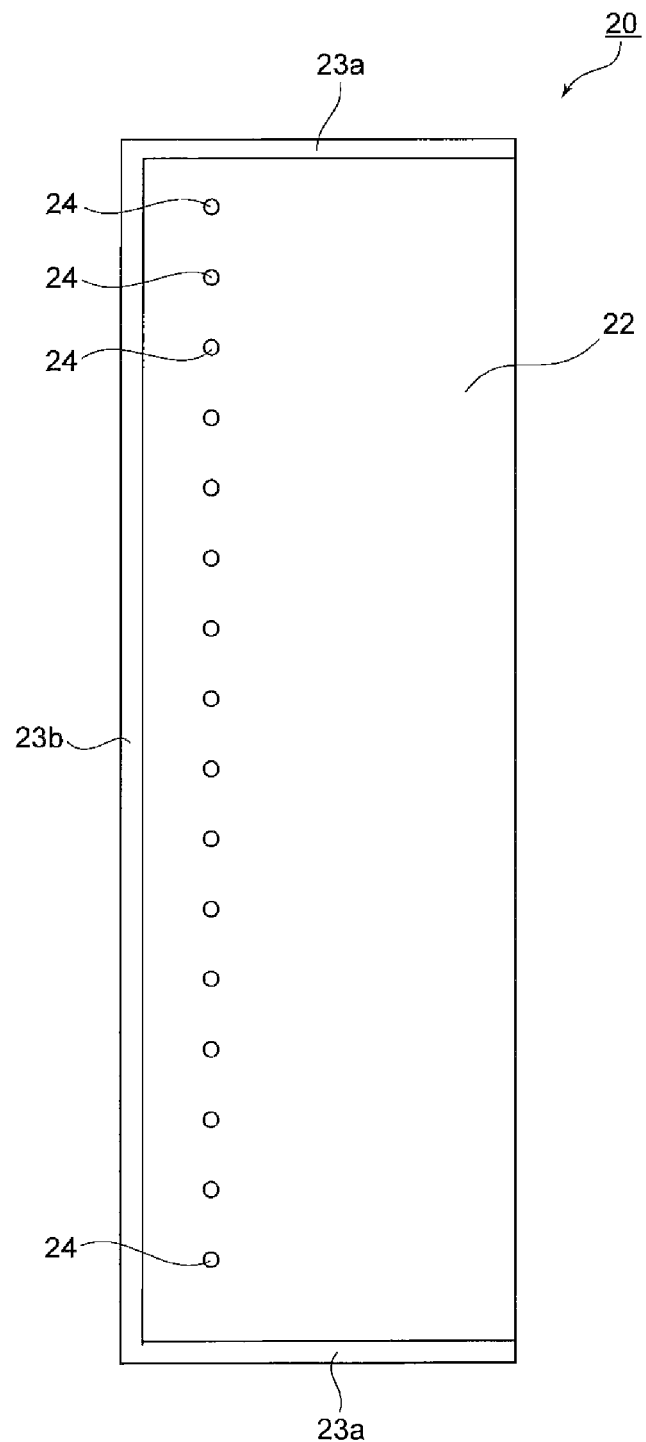
FIG. 4 is a plan view of a low-voltage electrode of the dielectric barrier plasma generator shown in FIG. 1.

FIG. 1 is a perspective view schematically illustrating a dielectric barrier plasma generator according to a first embodiment. FIG. 2 is a cross-sectional view of the dielectric barrier plasma generator taken along the line A-A shown in FIG. 1. FIG. 3 is a cross-sectional view of the dielectric barrier plasma generator taken along a line orthogonal to the line A-A shown in FIG. 1. FIG. 4 is a plan view of a low-voltage electrode of the dielectric barrier plasma generator shown in FIG. 1. As shown in FIG. 1, the dielectric barrier plasma generator (hereinafter also referred to as "a plasma generator 10") includes a dielectric substrate 12, a high-voltage electrode 14, a low-voltage electrode 20, and a gas buffer substrate 26.

The dielectric substrate 12 has a flat plate shape and includes a portion having a thickness being thinner when being closer to a blowout outlet 30. Specifically, the dielectric substrate 12 includes a flat portion 12a having a constant thickness, and an inclined portion 12b formed continuously from the flat portion 12a and having a thickness being thinner when being closer to the blowout outlet 30. The inclined portion 12b has a first surface 13a (the upper surface in FIG. 1) that is inclined in a direction closer to the low-voltage electrode 20.

The dielectric substrate 12 is preferably made of a material having a low relative permittivity from a viewpoint of generating a larger amount of plasma per unit power. The relative permittivity of the material is preferably 10 or less. When a lower limit of the relative permittivity of the material is lower, it is more preferable; for example, it can be 4 or more.

The dielectric substrate 12 can be made of any materials; however it is preferably made of a material with the lowest permittivity when possible. Ceramics are preferred from a standpoint of durability. Examples of the ceramics include alumina, aluminum nitride, and steatite. Alumina, aluminum nitride, and steatite have comparatively low relative permittivity, comparatively high strength, and excellent durability. Hence, the dielectric substrate 12 being made of alumina, aluminum nitride, or steatite, enables the amount of plasma generated per unit power to be increased. In addition, this configuration reduces a risk of damage even when the dielectric substrate 12 is made thinner. Furthermore, the dielectric substrate 12 may be made of a material that contains a substance that assists electron generation in addition to the above dielectric materials, which are its base material. Examples of the substance that assists electron generation include silver, platinum, copper, carbon, and transition metal compounds. Applying an electric field to the substance that assists electron generation causes initial electrons to be generated and released into a discharge space. This favorably benefits the starting performance. The dielectric substrate 12 may preferably contain the substance, which assists the electron generation, of 1% by weight or less with respect to the dielectric substrate 12 as a whole (when the dielectric substrate 12 is set to 100% by weight). When the substance that assists electron generation is made to be contained in the dielectric substrate 12, the reason for setting the content of the substance that assists electron generation to be 1% by weight or less contributes to suppressing the present substance from evaporating and dispersing due to the discharge as much as possible. The material that evaporates and disperses with the discharge is blown out with the plasma as fine particles and contaminates the object to be irradiated. When the substance that assists electron generation is made to be contained in the dielectric substrate 12, the content of the substance is preferably 0.05% by weight or more.

The high-voltage electrode 14 is provided on the first surface 13a of the dielectric substrate 12. In the present specification, the left-right directions in FIG. 2 are denoted as the "length direction" and a direction orthogonal to the length direction is denoted as the "width direction".

The high-voltage electrode 14 has approximately the same width as the width of the dielectric substrate 12, and is formed continuously from the flat portion 12a of the dielectric substrate 12 to the vicinity of the second end (right end in FIG. 2). The high-voltage electrode 14 can have any width; however the high-voltage electrode 14 may preferably have a wide width as possible in a standpoint of ejecting a wide plasma from the blowout outlet 30 because the plasma is made to be generated on the lower side in which the high-voltage electrode 14 is provided. The high-voltage electrode 14 preferably has the same width as the width of the blowout outlet 30 or wider than the width of the blowout outlet 30. In the plasma generator 10, since the plasma is made to be generated on the lower side of the inclined portion 12b, the high-voltage electrode 14 is not necessarily formed on the flat portion 12a. However, as in the present embodiment, the high-voltage electrode 14 is preferably formed on the flat portion 12a to the extent that it is suitable to be connected with the power supply unit 42 or the like.

The second end of the high-voltage electrode 14 (the right end in FIG. 2) does not reach the surface on which the blowout outlet 30 is formed. In other words, a predetermined clearance 15 is provided between the second end of the high-voltage electrode 14 and the surface on which the blowout outlet 30 is formed.

In the vicinity of the blowout outlet 30, direct discharge may occur between the high-voltage electrode 14 and the low-voltage electrode 20 without passing through the dielectric substrate 12. Such discharge damages the high-voltage electrode 14, dielectric substrate 12, and low-voltage electrode 20, thereby causing the materials constituting these components to mix into the plasma as impurities. From a standpoint of discharge efficiency, it is advantageous to mount the high-voltage electrode at the front edge of the blowout outlet. However, this configuration allows the distance between the high-voltage electrode and the low-voltage electrode to become significantly shorter, causing creeping discharge on the dielectric substrate. Once the discharge occurs, it does not form dielectric barrier discharge, but moves on to direct discharge, thus an excessive discharge current flows, thus an excessive discharge current flows, causing damage to the electrodes and eventually damage to the power supply unit. Hence, the plasma generator 10 has the configuration in which the predetermined clearance 15 is provided between the second end of the high-voltage electrode 14 and the surface on which the blowout outlet 30 is formed. This configuration prevents the direct discharge between the high-voltage electrode 14 and the low-voltage electrode 20, and enables the discharge between the high-voltage electrode 14 and the low-voltage electrode 20 through the dielectric substrate 12, thereby preventing damage to the high-voltage electrode 14, dielectric substrate 12, and low-voltage electrode 20. The clearance 15 may preferably be, for example, in the range of 1 to 5 mm.

The high-voltage electrode 14 can be made of any material; however, it may be preferably made of a highly conductive material, for example, compounds using copper, silver, aluminum, or gold.

The high-voltage electrode 14 can be formed from a foil-like metal. Examples of the high-voltage electrode 14 include a metal foil such as a copper foil and an aluminum foil that are provided with adhesive processing on one side thereof. The high-voltage electrode 14 can also be a sintered body containing conductive metal. The sintered body containing the conductive metal can be formed by printing metal paste on the surface of the dielectric substrate 12. This configuration eliminates the need for using an adhesive when forming the high-voltage electrode 14 on the dielectric substrate 12. The high-voltage electrode 14 may be formed by plating, vapor deposition, or sputtering and thermal spraying. This configuration eliminates the need for using an adhesive when forming the high-voltage electrode on the dielectric substrate. The high-voltage electrode 14 and the dielectric substrate 12 is preferably adhered to each other as closely as possible, and their connection interface preferably has no air layer. The air layer may generate discharge inside the space, which in turn generates radicals, degrading the electrode. Hence, the high-voltage electrode 14 and the dielectric substrate 12 are preferably formed to adhere to each other on the order of micrometers at their connection interface. The thickness of the high-voltage electrode 14 is very thin compared to that of the dielectric substrate 12. The high-voltage electrode 14 being formed from the thin metal makes any expansion of the metal to be absorbed by the thin metal, causing the effect of the expansion to be negligible on the dielectric substrate 12. Furthermore, in the conventional method, the thickness of the dielectric substrate 12 needs to be increased to avoid damage to the ceramics. In contrast, the present embodiment enables the thickness of the dielectric substrate to be thin, which reduces dielectric loss in the dielectric layer, and increases the effect of introducing energy into the gas, making it possible for the efficient plasma generation. Generally, this configuration is capable of providing an efficient device with a small amount of material, which is beneficial in terms of resources and environment.

The high-voltage electrode 14 is connected to the power supply unit 42 at a first end of the high-voltage electrode 14. In the first embodiment, a power introduction section 34 for connecting to the power supply unit 42 is provided on the first end of the high-voltage electrode 14. The method of connecting the power supply unit 42 to the high-voltage electrode 14 at the power introduction section 34 is not limiting as long as they are electrically connected and can withstand the applied voltage. Examples of the method include connection by solder and connection using various connectors such as coaxial connectors. However, since microwaves are not used in the present embodiment, there is no need to use coaxial connectors or coaxial cables with a specified characteristic impedance.

The applied voltage and frequency supplied from the power supply unit 42 suffices to be within a range that enables the plasma generator 10 to generate dielectric barrier discharge. Specifically, the applied voltage supplied from the power supply unit 42 is preferably in a range of 3 kV to 20 kV, and more preferably 10 kV or lower. The frequency of the applied voltage supplied from power supply unit 42 is preferably in a range of 20 kHz to 1000 kHz, and more preferably in a range of 100 kHz to 150 kHz. The reasons for setting an upper limit of 150 kHz are that the frequency is determined with the consideration of the plasma irradiation length of the dielectric barrier plasma generator and that the frequency detected with the noise terminal voltage conformed with the Electromagnetic Compatibility (EMC) standard is 150 kHz or higher.

The low-voltage electrode 20 has a plate shape and is provided in the side facing the second surface 13b (the lower surface in FIG. 2) of the dielectric substrate 12. The low-voltage electrode 20 may be connected to the ground potential directly or through a resistor. It may also be connected to the low voltage output of the power supply unit 42.

As shown in FIG. 2, the low-voltage electrode 20 is formed with a groove 22 on its surface facing the dielectric substrate 12, the groove extending from the first end (left end in FIG. 2) in the length direction (left-right direction in FIG. 2) to the second end (right end in FIG. 2). Specifically, as shown in FIG. 4, the groove 22 is formed in areas other than the outer circumferences 23a at both sides of the low-voltage electrode 20 in the width direction and the outer circumference 23b at the first end.

The dielectric substrate 12 and the low-voltage electrode 20 are stacked such that they are in contact with each other at the outer circumferences 23a and 23b. A space is formed in the portion where the groove 22 is formed, in other words, the space enclosed by the groove 22 and the second surface 13b of the dielectric substrate 12. This space forms a gas channel 25 to allow gas to flow from the first end to the second end.

As shown in FIG. 4, the groove 22 is provided with plurality of gas introduction paths 24 that are configured to be through holes at the first end thereof, and arranged with equal intervals in the width direction. The number of gas introduction paths 24 can be any number; however, it is preferably at least two as shown in the present embodiment. The configuration including the at least two gas introduction paths 24 readily make the gas flow in the gas channel 25 more laminar flow because the gas is introduced into the gas channel 25 from at least two locations. The plurality of gas introduction paths 24 are preferably arranged in the width direction so that gas is widely introduced at the location where the gas is introduced into the gas channel 25. The gas introduction path 24 may be a single wide open hole in the width direction.

As shown in FIGS. 2 and 3, the low-voltage electrode 20 and a gas buffer substrate 26 are stacked such that the lower surface of the low-voltage electrode 20 (the surface being opposite to a surface facing the dielectric substrate 12) is in contact with the gas buffer substrate 26. The gas buffer substrate 26 has a cavity 27 thereinside.

The cavity 27 inside the gas buffer substrate 26 is connected to a gas delivery device 40 (see FIG. 2). The gas that has been delivered from the gas delivery device 40 is stored in the cavity 27 and then flows through the plurality of gas introduction paths 24 into the gas channels 25.

The blowout outlet 30 is formed at the second end of the gas channel 25 to blow out the gas that has flown through the gas channel 25 and the plasma that has been generated in the gas channel 25. In the first embodiment, the width of the groove 22 (gas channel 25) is uniform from the first end to the second end, and the blowout outlet 30 has also the same width as that of the groove 22 (gas channel 25). This ensures that the flow of gas that has flown into the gas channel 25 fails to be disturbed and that the gas evenly flows out of the blowout outlet 30. This has been confirmed with simulation by the present inventors. However, the present invention is not limited to this example, and the width of the blowout outlet 30 may be adjusted as necessary. For example, setting the width of the blowout outlet 30 to be narrower than the width of the second end of the gas channel 25 enables the plasma to jet with high pressure. Setting the width of the blowout outlet 30 to be narrow to suit the discharging portion can generate a dense and uniform plasma. Setting the width of the blowout outlet 30 to be wider than the width of the second end of the gas channel 25 is capable of ejecting plasma with a wide width.

Examples of the gas supplied to the gas channel 25 (gas delivered from the gas delivery device 40) as starting gas at a time of starting include at least one type of gas selected from the group consisting of He, Ne, and Ar. Examples of the gas capable of generating desired active species as a gas for generating plasma after the plasma has been generated, include at least one type of gas selected from the group consisting of hydrogen, oxygen, water, and nitrogen.

In the present embodiment, the gas flow through the gas channel 25 is preferably laminar flow. The gas flow being laminar flow enables the plasma to jet more normally. The Reynolds number is a parameter that distinguishes laminar flow from turbulent flow. The Reynolds number Re is a dimensionless quantity expressed as Re=$\rho \cdot U \cdot L/\mu$ where the density of the fluid is $\rho$ (kg/m3), the flow velocity is U (m/s), the characteristic length is L (m), and the viscosity coefficient of the fluid is $\mu$ (Pa·s). The Reynolds number that serves as the boundary between laminar flow and turbulent flow refers to the critical Reynolds number, and its value is known to be between 2000 and 4000. In the plasma generator used in Example 1 below, when the flow rate is set to 0.005 m$^3$/sec (300 L/min), short side: 0.5 mm, and long side: 700 mm, then U=14.3 (m/s) and L=9.99×10$^{-4}$ (m) are calculated. When the fluid is considered to be dry air at standard atmospheric pressure, $\rho$=1.205 (kg/m$^3$) and $\mu$=1.822×10$^{-5}$ (Pa·s) are obtained. From these values, the Reynolds number is calculated to be approximately 945, which is below the critical Reynolds number, thereby determining that the flow is laminar flow.

Applying the voltage from the power introduction section 34 to the high-voltage electrode 14 causes discharge at a location in the gas channel 25 where the voltage applied to a gas exceeds its dielectric breakdown voltage. Specifically, in the plasma generator 10, since the dielectric substrate 12 includes a portion having a thickness being thinner when being closer to the blowout outlet 30, the portion has a larger electrostatic capacitance when being closer to the blowout outlet 30. Hence, setting the slope of the thickness of the dielectric substrate 12 and the applied voltage in a manner in which the voltage applied to gas exceeds its dielectric breakdown voltage in the vicinity of the blowout outlet enables plasma to be made to be generated widely in the width direction in the vicinity of the blowout outlet 30. The plasma is then blown out from the blowout outlet 30 along with the gas flow. As described above, the plasma generator 10 is capable of uniformly ejecting plasma from the entire region of the blowout outlet 30. In addition, generating plasma in the vicinity of the blowout outlet 30 improves the plasma generation efficiency.

In the plasma generator 10, the groove 22 is formed in the low-voltage electrode 20, and the portion enclosed by the groove 22 and the second surface 13*b* of the dielectric substrate 12 forms the gas channel 25. The dielectric substrate 12 itself has a flat plate without grooves or holes. In general, processing (in the first embodiment, forming the groove 22) the low-voltage electrode 20, which is made of metal, is easier than processing the dielectric substrate, which is made of ceramic or other material. Hence, this configuration enables the plasma generator 10 to be readily manufactured. Since the dielectric substrate 12 is flat, the plasma generator 10 can be made thin. Therefore, this configuration is capable of increasing the amount of plasma generated per unit power, enabling efficient plasma generation.

In the first embodiment, the width of the groove 22 (gas channel 25) is uniform from the first end to the second end; however, the present invention is not limited to this example. The width of the groove (gas channel) is not necessarily to be uniform from the first end to the second end. For example, the width of the groove (gas channel) may be configured to become narrower from the first end to the second end. The width of the groove (gas channel) may also be configured to become wider from the first end to the second end.

The first embodiment describes the case in which the gas introduction path 24 is provided in the groove 22 of the low-voltage electrode 20, and gas is introduced into the gas channel 25 from the lower side of the low-voltage electrode 20; however, the position of the gas introduction path is not limited to this example in the present invention. In the present invention, the gas introduction path may be disposed at a position that allows gas to flow from the outside into the first end of the gas channel. For example, the gas introduction path may be disposed in the side surface of the first end of the low-voltage electrode 20.

The plasma generator 10 can have any size; however it can be as follows as an example.

Appearance Dimensions:
Width 750 mm, Length 40 mm, Thickness 20 mm (thickest)
Outline dimensions of the dielectric substrate 12:
Width 750 mm, Length of the flat portion 12*a* 20 mm, Thickness of the flat portion 12*a* 4 mm, Length of the inclined portion 12*b* 20 mm, Thickness of the inclined portion 12*b* directly above the blowout outlet 30 0.1 mm
Outline dimensions of the low-voltage electrode 20:
Width 750 mm, Length 20 mm, Thickness 0.1 mm
Approximate dimensions of the gas channel 25:
Width 700 mm, Length 35 mm, Thickness 1.5 mm
Dimensions of the blowout outlet 30:
Width of the opening 700 mm, Height of the opening 0.2 mm The plasma generator (hereinafter referred to as the "plasma generator according to Example 1"), in which the above dimensions are adopted, the dielectric substrate 12 is made of alumina, the high-voltage electrode 14 is made of conductive materials including copper as a primary material, and the low-voltage electrode 20 is made of copper, was operated to generate plasma with flowing gas while applying a voltage on the following conditions.

Applied voltage: 7.6 kVpp, Frequency 38 kHz, Gas type: nitrogen, Gas flow rate 300 L/min

[Verification of Uniform Plasma Jet]

Figure 5:
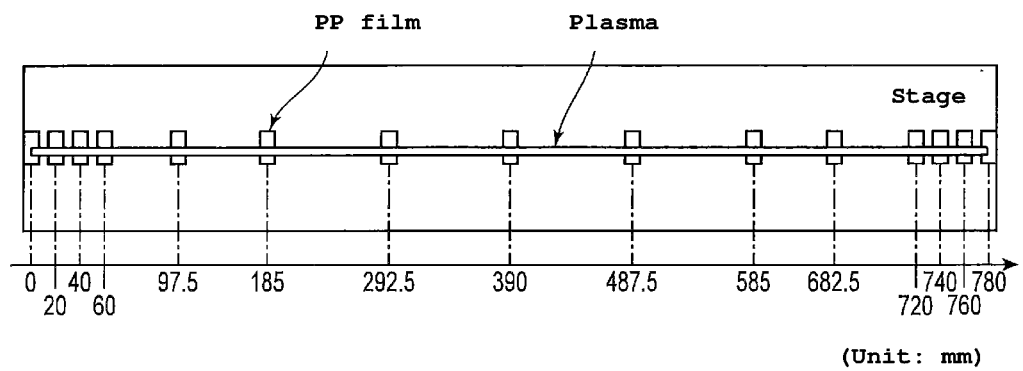
FIG. 5 is a plan view in which polypropylene (PP) films as objects to be irradiated are placed on a stage at predetermined intervals.

FIG. 5 is a plan view in which polypropylene (PP) films as objects to be irradiated are placed on a stage at predetermined intervals. As shown in FIG. 5, the polypropylene (PP) films were placed on the stage as the objects to be irradiated at the predetermined intervals, and was irradiated with plasma from above using the plasma generator according to Example 1. The PP films were fixed on a uniaxial stage at a position 2 mm (irradiation distance) apart from the blowout outlet, and were irradiated with plasma by allowing the blowout outlet to conduct reciprocating motions at a speed of 100 mm/sec. The water contact angle on the surface of each PP film was measured after the twice irradiation (after the twice reciprocating motions), after the 10 times irradiation (after the 10 times reciprocating motions), and after 200 times irradiation (after the 200 times reciprocating motions). The water contact angle was measured as follows. The water contact angle was measured under the following conditions. Contact angle meter: DMs-401 (Kyowa Interface Science Co., Ltd), Liquid volume: 2 μL, Approximation by elliptical fitting.

Figure 6:
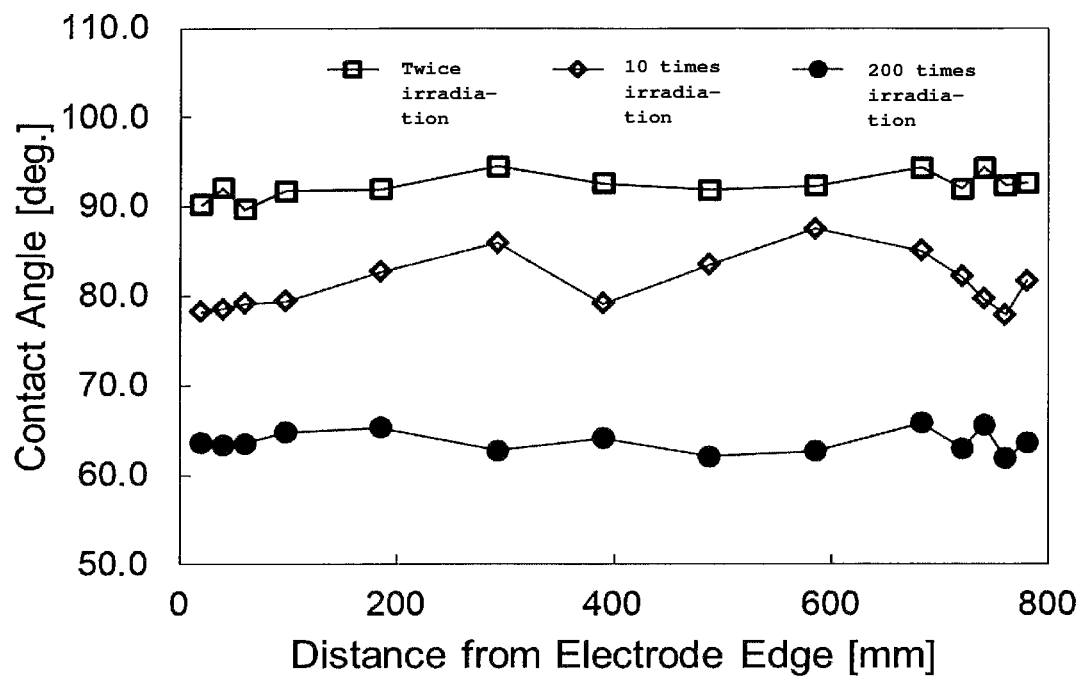
FIG. 6 is a graph that indicates the measurement results of the water contact angle.

FIG. 6 is a graph that indicates the measurement results of the water contact angle. As can be seen from FIG. 6, the water contact angle was within ±10% in the width direction with respect to the average value under all of the irradiation conditions. In addition, the polypropylene (PP) films were also placed at 10 mm, 30 mm, and 50 mm in FIG. 6 to conduct the same test, and the water contact angle was confirmed to be within ±10% with respect to the average value shown in FIG. 6. These results indicate that the plasma uniformly jets from the entire region of the blowout outlet.

The plasma generator 10 according to the first embodiment has been described above.

Variation Examples

FIGS. 7 to 11 are partial cross-sectional views illustrating variation examples of the dielectric barrier plasma generator according to the first embodiment. The configuration of the parts not shown in FIGS. 7 to 11 is the same as that of the plasma generator 10 according to the first embodiment. In the following, points that differ from the plasma generator 10 described above will be mainly described, and points in common will be omitted or simplified. The same symbols will be assigned to configurations that are common to the plasma generator 10.

Figure 7:
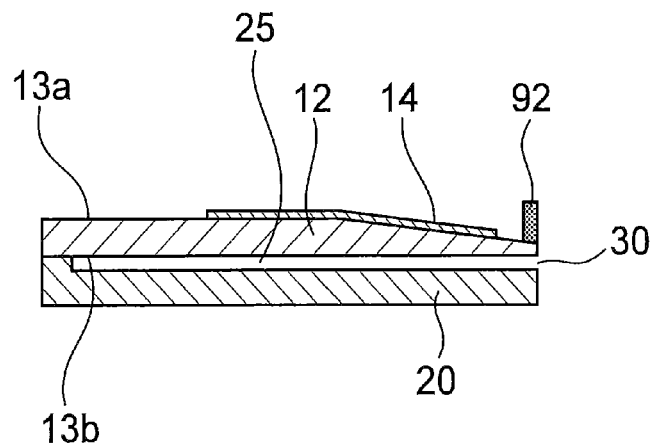
FIG. 7 is a partial cross-sectional view illustrating a variation example 1 of the dielectric barrier plasma generator according to the first embodiment.
Figure 8:
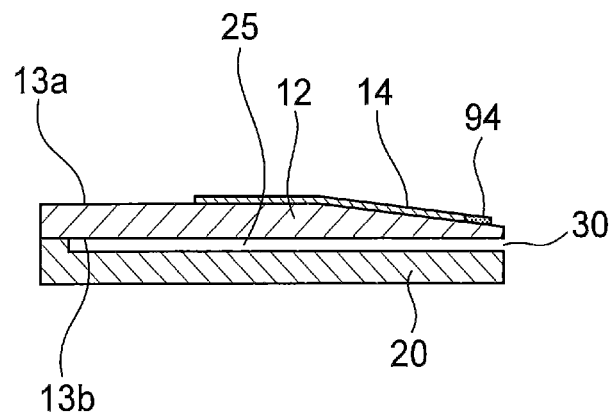
FIG. 8 is a partial cross-sectional view illustrating a variation example 2 of the dielectric barrier plasma generator according to the first embodiment.

In Variation Example 1 shown in FIG. 7 and Variation Example 2 shown in FIG. 8, a protrusion (a protrusion 92 in Variation Example 1, a protrusion 94 in Variation Example 2) is provided on the dielectric substrate 12 between the high-voltage electrode 14 and the blowout outlet 30, making the dielectric substrate with the protrusion that separates the high-voltage electrode 14 from the low-voltage electrode 20. Specifically, in Variation Example 1, the protrusion 92 is provided at the end of the dielectric substrate 12 (directly above the blowout outlet 30). In Variation Example 2, the projection 94 is provided to be in contact with the end of the high-voltage electrode 14 that is closest to the blowout outlet 30. It is also possible to provide the protrusion 92 and the protrusions 94 simultaneously.

The protrusions 92 and 94 can be made of a material exemplified as that of the dielectric substrate 12; however, the protrusions 92 and 94 may be made of the same material or different material from that of the dielectric substrate. The protrusions 92 and 94 may be integrally formed with the dielectric substrate 12 or may be attached thereto as a separate component.

Variation Example 1 and Variation Example 2 are configurations intended to ensure a creepage distance, while allowing the distance between the high-voltage electrode and the low-voltage electrode to be made closer. In Variation Example 1 and Variation Example 2, ensuring a creepage distance and a clearance distance between the high-voltage electrode and the low-voltage electrode prevents unnecessary discharge such as short circuits and the occurrence of creeping discharge between the two electrodes.

Figure 9:
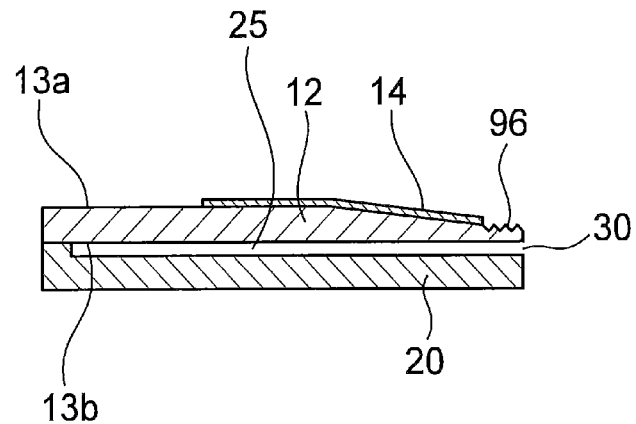
FIG. 9 is a partial cross-sectional view illustrating a variation example 3 of the dielectric barrier plasma generator according to the first embodiment.

Variation Example 3 shown in FIG. 9 describes a configuration in which an unevenness 96 is provided on the dielectric substrate 12 between the end of the high-voltage electrode 14 that is closest to the blowout outlet 30 and a place directly above the blowout outlet 30, ensuring a creepage distance. The increased creepage distance due to the unevenness 96 allows its resistance value to increase, reducing the risk of creeping discharge.

Figure 10:
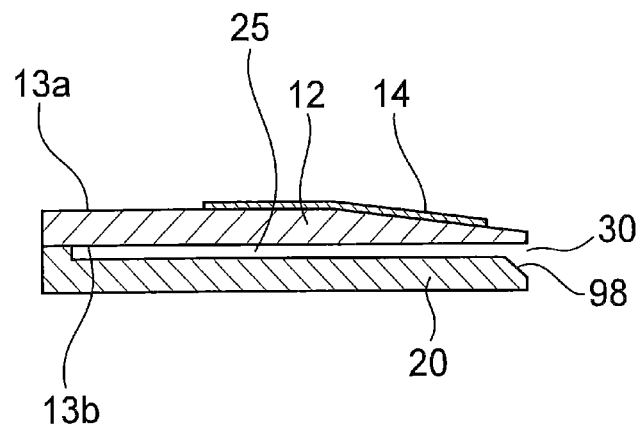
FIG. 10 is a partial cross-sectional view illustrating a variation example 4 of the dielectric barrier plasma generator according to the first embodiment.

Variation Example 4 shown in FIG. 10 describes a configuration in which the groove 22 of the low-voltage electrode 20 has a tapered portion 98 such that the groove 22 has a wider opening height when being closer to the blowout outlet 30. This configuration ensures a creepage distance between the high-voltage electrode 14 and the low-voltage electrode 20.

Figure 11:
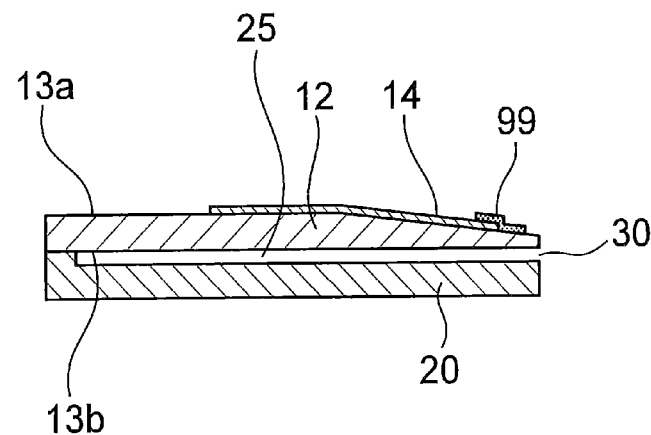
FIG. 11 is a cross-sectional view illustrating a variation example 5 according to the first embodiment.

Variation Example 5 shown in FIG. 11 describes a configuration in which an insulating film 99 is formed at the end of the high-voltage electrode 14 that is closer to the blowout outlet 30 so as to cover the high-voltage electrode 14. Covering the end of the high-voltage electrode 14 with the insulating film 99 prevents unnecessary discharge such as corona discharge. Examples of the insulating film 99 include glass, sintered bodies containing glass, silicon, and resin materials such as epoxy.

Variation Examples 1 to 5 can ensure a certain distance on a creepage distance and/or a clearance distance between the high-voltage electrode 14 and the low-voltage electrode 20. As a result, this configurations prevent materials constituting these configurations from mixing into the plasma as impurities. They also prevents the electrode wear and the damage to the power supply unit, thus leading to extending the service life of the device. These measures that ensure the creepage distance enable the end of the high-voltage electrode 14 that is closer to the blowout outlet 30 to be positioned closer to the blowout outlet 30, thus achieving highly efficient plasma generation.

In discharge, a short distance between the high-voltage electrode and the low-voltage electrode is desirable in view of electrical energy. In other words, the high-voltage electrode is preferably extended to be disposed at the front edge of the blowout outlet. However, arranging both of the electrodes in this manner makes the creepage distance between the high-voltage electrode and the low-voltage electrode become significantly shorter, which may cause creeping discharge on the dielectric substrate. Hence, the high-voltage electrode is preferably disposed at a location far enough from above the blowout outlet to prevent creeping discharge from occurring, thereby ensuring an appropriate creepage distance. As mentioned above, the high-voltage electrode is ideally desirable to be disposed at the front edge of the blowout outlet so as to shorten the distance between the high-voltage electrode and the low-voltage electrode. Hence, measures need to be taken to reduce the distance between the high-voltage electrode and the low-voltage electrode while maintaining the creepage distance. As shown in Variation Example 1 and Variation Example 2, the measures include a method in which the protrusion is provided on the dielectric substrate between the high-voltage electrode and the blowout outlet, allows the dielectric substrate to have the protrusion separating the high-voltage electrode from the low-voltage electrode. In addition, as shown in Variation Example 3, the measures to ensure the creepage distance include a method in which the unevenness is provided on the dielectric substrate between the high-voltage electrode and the front edge of the blowout outlet to ensure its creepage distance. In addition, as shown in Variation Example 4, the measures to ensure the creepage distance include a method of configuring a structure in which the end of the low-voltage electrode in the vicinity of the blowout outlet is shaved to make the blowout outlet become wider to ensure the creepage distance between the high-voltage electrode and the low-voltage electrode. In addition, as shown in Variation Example 5, the methods include a method in which the insulator is formed at the end of the high-voltage electrode that is closer to the blowout outlet to forcefully protect the occurrence of direct discharge on the surface. These measures to ensure the creepage distance allow the end of the high-voltage electrode that is closer to the blowout outlet to be disposed closer to the blowout outlet, thus achieving highly efficient plasma generation. Therefore, ensuring the creepage distance and the clearance distance between the high-voltage electrode and the low-voltage electrode prevents unnecessary discharge such as short circuits and creeping discharge between the two electrodes.

Second Embodiment

Hereinafter, a plasma generator 50 according to the second embodiment is will be described. The plasma generator 50 according to the second embodiment differs from the plasma generator 10 in the shape of the dielectric substrate, high-voltage electrode and low-voltage electrode, and is common in other points. Accordingly, the different points will be mainly described, and the common points will be omitted or simplified in the following. In addition, the same symbol is assigned to the configuration common to the plasma generator 10 according to the first embodiment.

Figure 12:
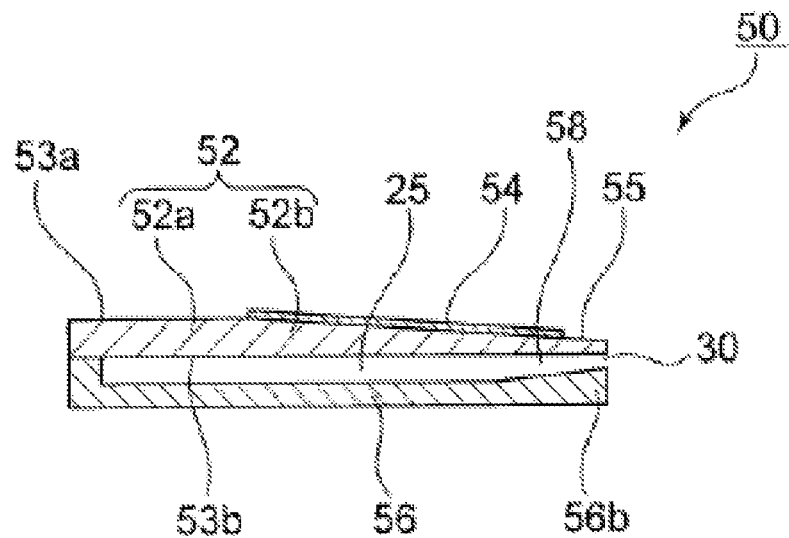
FIG. 12 is a cross-sectional view of a dielectric barrier plasma generator according to a second embodiment.

FIG. 12 is a cross-sectional view of a dielectric barrier plasma generator according to the second embodiment. As shown in FIG. 12, the plasma generator 50 includes a dielectric substrate 52, a high-voltage electrode 54, and a low-voltage electrode 56.

The dielectric substrate 52, similar to the dielectric substrate 12, includes a flat portion 52a having a constant thickness and an inclined portion 52b formed continuously from the flat portion 52a and having a thickness being thinner when being closer to the blowout outlet 30. However, the flat portion 52a of the dielectric substrate 52 has a shorter length than the flat portion 12a of the dielectric substrate 12, and the inclined portion 52b has a more gradual slope than the inclined portion 12b.

The high-voltage electrode 54 has approximately the same width as the width of the dielectric substrate 52, and is provided on the inclined portion 52b of the dielectric substrate 52. In the second embodiment, the high-voltage electrode 54 is not provided on the flat portion 52a. The second end of the high-voltage electrode 54 (the right end in FIG. 12) does not reach the surface on which the blowout outlet 30 is formed, which is similar to the first embodiment. In other words, a predetermined clearance 55 is provided between the second end of the high-voltage electrode 54 and the surface on which the blowout outlet 30 is formed.

The low-voltage electrode 56 has a plate shape and is provided in the side facing the second surface 53b (the lower surface in FIG. 2) of the dielectric substrate 52. The low-voltage electrode 56 is formed with the groove 22 that is similar to that of the low-voltage electrode 20 according to the first embodiment. The groove 22 is formed with an inclined portion 56b having a thickness being thicker when being closer to the blowout outlet 30. As a result, the gas channel 25 includes a portion 58 in which a gap between the dielectric substrate 52 and the low-voltage electrode 56 becomes narrower when being closer to the blowout outlet 30. The second embodiment, which includes the portion in which the gap between the dielectric substrate 52 and the low-voltage electrode 56 becomes narrower when being closer to the blowout outlet 30, enables the amount of variation in capacitance to be further increased. In addition, including the portion in which the gap between the high-voltage electrode and the low-voltage electrode becomes narrower when being closer to the blowout outlet 30 enables the probability of discharge start to be improved. Since the discharge start voltage is proportional to the product of pressure and distance, the discharge will start near a tip where the distance between the high-voltage electrode and the low-voltage electrode is close in the initial start, and the discharge will subsequently spread to the area with a thicker dielectric layer in the rear part. Including the portion in which the gap between the dielectric substrate 52 and the low-voltage electrode 56 becomes narrower when being closer to the blowout outlet 30 enables the plasma generator to be reliably started and discharged stably. Including the portion in which the distance between the high-voltage electrode and the low-voltage electrode is close along the longitudinal direction of the blowout outlet allows plasma to be generated evenly near the tip of the blowout outlet even when the plasma discharge is performed at low power, enabling uniform processing. Therefore, this configuration is capable of adjusting the power input to the plasma generator, expanding the range of plasma processing applications.

The plasma generator 50 according to the second embodiment has been described on the above.

Third Embodiment

Hereinafter, a plasma generator 60 according to the third embodiment is described. The plasma generator 60 according to the third embodiment differs from the plasma generator 50 in that a protective layer is provided in the vicinity of the blowout outlet and on the low-voltage electrode, and is common in other points. Accordingly, the different points will be mainly described, and the common points will be omitted or simplified in the following. In addition, the same symbol is assigned to the configuration common to the plasma generator 50 according to the second embodiment.

Figure 13:
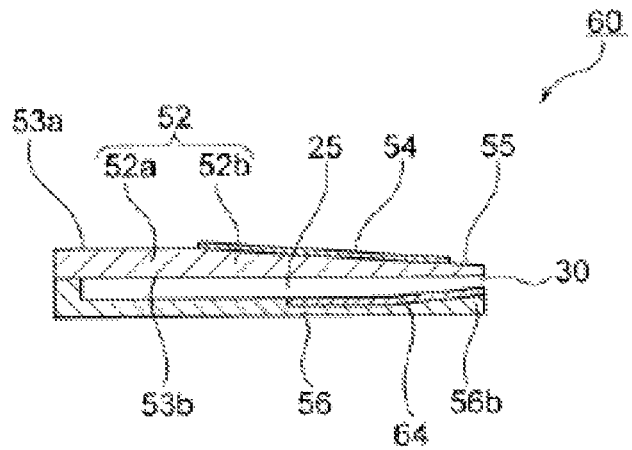
FIG. 13 is a cross-sectional view of a dielectric barrier plasma generator according to a third embodiment.

FIG. 13 is a cross-sectional view schematically illustrating a dielectric barrier plasma generator according to the third embodiment. As shown in FIG. 13, the plasma generator 60 is provided with a dielectric substrate 52, a high-voltage electrode 54, and a low-voltage electrode 56.

A protective layer 64 is formed in the vicinity of the blowout outlet 30 and on the low-voltage electrode 56 to prevent the scattering of the material constituting the low-voltage electrode 56. In the present embodiment, the protective layer 64 is formed to cover at least the inclined portion 56b. The protective layer 64 is preferably made of a dielectric material. The material of the protective layer 64 is preferably the same material as that of the dielectric substrate 52. Examples of the material of the protective layer 64 include alumina, aluminum nitride, and steatite.

The method of forming the protective layer 64 on the low-voltage electrode 56 can be any method, and includes the method of thermal spraying to apply materials that will become the protective layer 64. Forming the protective layer 64 by thermal spraying has an advantage in that it can be fabricated easily. The thickness of the protective layer 64 can be set appropriately from the viewpoint of contamination prevention; however, 100 µm or less can be adopted, for example.

In the plasma generator 60 according to the third embodiment, since the protective layer 64 is provided near the area where plasma is generated, that is, in the vicinity of the blowout outlet 30, and on the low-voltage electrode 56, the evaporation and diffusion of the material constituting the low-voltage electrode 56 can be suppressed, thereby preventing the object to be irradiated from being contaminated.

The plasma generator 60 according to the third embodiment has been described on the above.

Fourth Embodiment

Hereinafter, a plasma generator 70 according to the fourth embodiment is described. The plasma generator 70 of the fourth embodiment differs from the plasma generator 10 according to the first embodiment in that an auxiliary starting member is disposed in the vicinity of the blowout outlet and on the second surface of the dielectric substrate, and is common in other points. Accordingly, the different points will be mainly described, and the common points will be omitted or simplified in the following. In addition, the same symbol is assigned to the configuration common to the plasma generator 10 according to the first embodiment.

Figure 14:
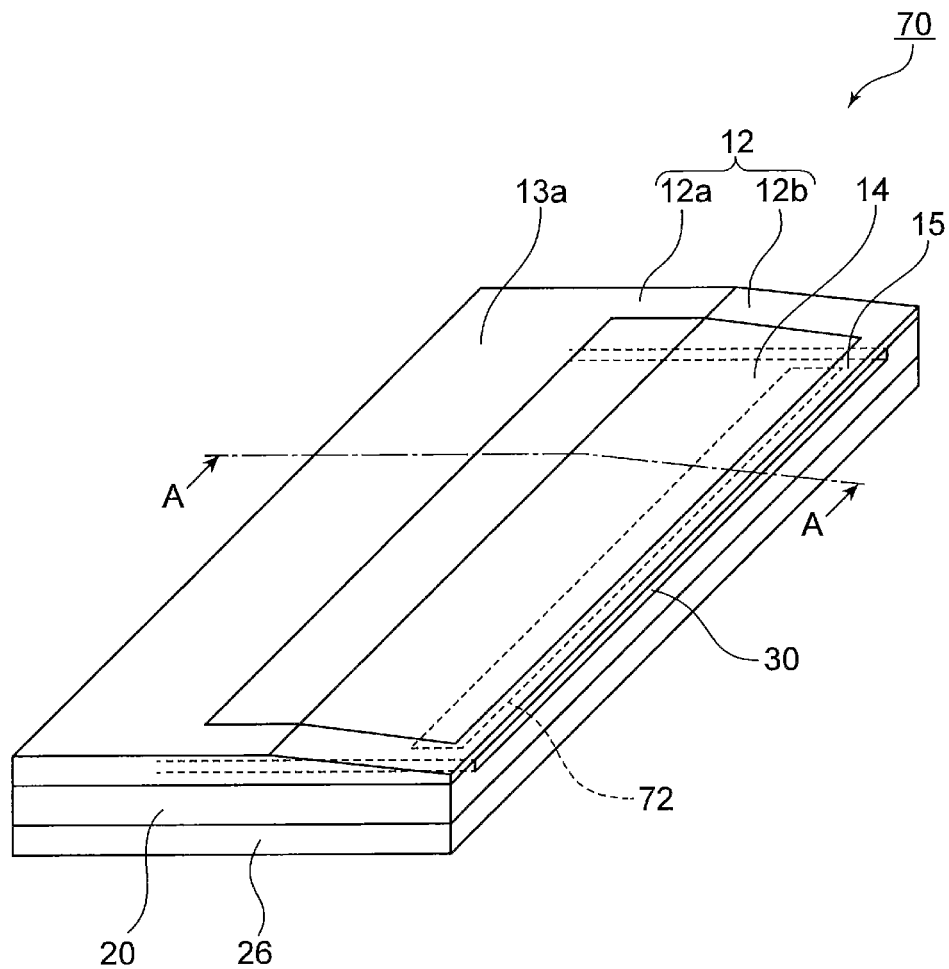
FIG. 14 is a perspective view of a dielectric barrier plasma generator according to a fourth embodiment.
Figure 15:
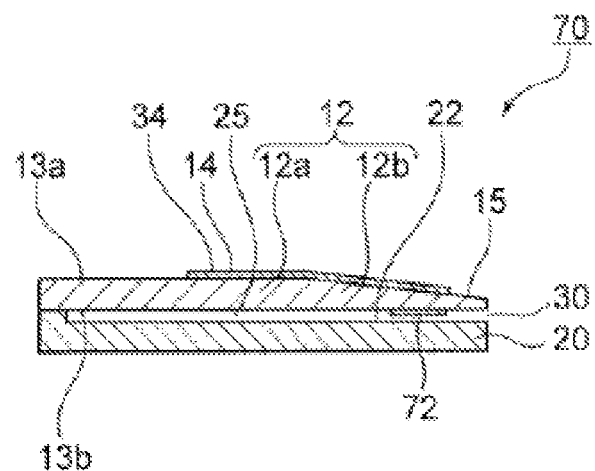
FIG. 15 is a cross-sectional view of the dielectric barrier plasma generator taken along the line A-A shown in FIG. 14.

FIG. 14 is a perspective view schematically illustrating a dielectric barrier plasma generator of the fourth embodiment. FIG. 15 is a cross-sectional view of the dielectric barrier plasma generator taken along the line A-A shown in FIG. 14. In FIG. 15, the gas buffer substrate is omitted. As shown in FIGS. 14 and 15, the plasma generator 70 is provided with the dielectric substrate 12, the high-voltage electrode 14, the low-voltage electrode 20, and the gas buffer substrate 26.

An auxiliary starting member 72 is disposed in the vicinity of the blowout outlet 30 and on the second surface 13*b* of the dielectric substrate 12.

Examples of the material of the auxiliary starting member 72 include carbon and transition metal compounds. The material of the auxiliary starting member 72 includes a material having a relative permittivity higher than that of the dielectric substrate 12. When the auxiliary starting member 72 is made of a material with a relative permittivity higher than that of the dielectric substrate 12, the material is heated due to its dielectric loss, supplying initial electrons to the space. Carbon is preferable for the material of the auxiliary starting member 72 among other materials. Carbon, which has high thermal stability, prevents evaporation of the auxiliary starting member 72 due to heating or the like after being mounted, thereby enhancing the reliability of the plasma generator 70. The material of the auxiliary starting member 72 may include a material having a low work function that allows electron emission at a lower applied voltage.

Since the plasma generator 70 is provided with the auxiliary starting member 72 in the vicinity of the blowout outlet 30 and on the second surface 13*b* of the dielectric substrate 12, where the plasma is made to be generated, the initial electrons are supplied to the space in the vicinity of the blowout outlet 30 and on the second surface 13*b* of the dielectric substrate 12. This eliminates the need for a microwave oscillator with large power capacity and a starter circuit device, thereby providing a compact and inexpensive plasma generator.

The fourth embodiment describes the case in which the protective layer 64 is not provided; however, the fourth embodiment may be configured to be provided with the auxiliary starting member 72 and the protective layer 64.

The plasma generator 70 according to the fourth embodiment has been described on the above.

Fifth Embodiment

Hereinafter, a plasma generator 80 according to the fifth embodiment is described. The plasma generator 80 according to the fifth embodiment differs from the plasma generator 10 according to the first embodiment in that a light-shielding member is provided at the blowout outlet, and is common in other points. Accordingly, the different points will be mainly described, and the common points will be omitted or simplified in the following. In addition, the same symbol is assigned to the configuration common to the plasma generator 10 according to the first embodiment.

Figure 16:
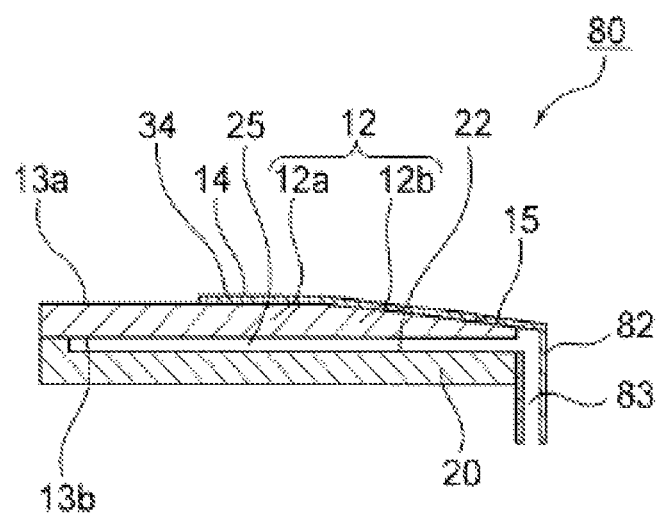
FIG. 16 is a cross-sectional view of a dielectric barrier plasma generator according to a fifth embodiment.

FIG. 16 is a cross-sectional view schematically illustrating a dielectric barrier plasma generator according to the fifth embodiment. As shown in FIG. 16, the plasma generator 80 is provided with the dielectric substrate 12, the high-voltage electrode 14 and the low-voltage electrode 20.

As shown in FIG. 16, a light-shielding member 82 is provided at the blowout outlet 30. The light-shielding member 82 includes a cavity 83 that allows the gas that has flown through the gas channel 25 to circulate. The cavity 83 is communicated with the gas channel 25. The cavity 83 of the light-shielding member 82 is provided at a right angle to the direction of the gas flow in the gas channel 25. This configuration prevents the light from the discharge in the gas channel 25 from radiating onto the object to be irradiated.

The plasma generator 80 according to the fifth embodiment has been described on the above.

In the above-mentioned embodiment, the case in which the dielectric substrate includes a flat portion is described; however, in the present invention, the dielectric substrate may not include the flat portion, and may only include an inclined portion.

In the above-mentioned embodiment, described is the case in which "a portion having a thickness being thinner when being closer to the blowout outlet" is an inclined portion, in other words, the inclined portion formed continuously from the flat portion 12*a* and having a thickness being thinner linearly when being closer to the blowout outlet 30. However, "a portion having a thickness being thinner when being closer to the blowout outlet" of the present invention is not limited to this example. The portion may include a portion having a thickness being thinner in a polynomial manner such as a quadratic curve or a cubic curve or exponentially when being closer to the blowout outlet. The portion may also include a portion having a thickness being thinner discontinuously such as a staircase shape when being closer to the blowout outlet.

Sixth Embodiment

Hereinafter, a plasma generator 100 according to the sixth embodiment is described. The plasma generator 100 according to the sixth embodiment differs from the plasma generator 10 according to the first embodiment in the shape of the dielectric substrate, the high-voltage electrode, and the groove formed in the low-voltage electrode, and is common in other points. Accordingly, the different points will be mainly described, and the common points will be omitted or simplified in the following. In addition, the same symbol is assigned to the configuration common to the plasma generator 10 according to the first embodiment.

Figure 17:
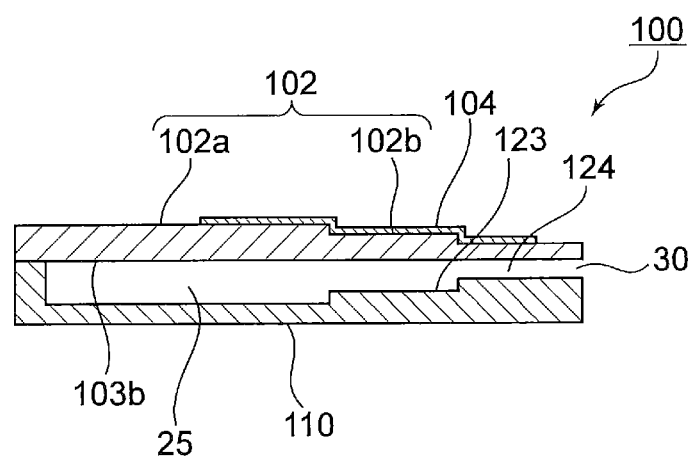
FIG. 17 is a cross-sectional view of a dielectric barrier plasma generator according to a sixth embodiment.
Figure 18:
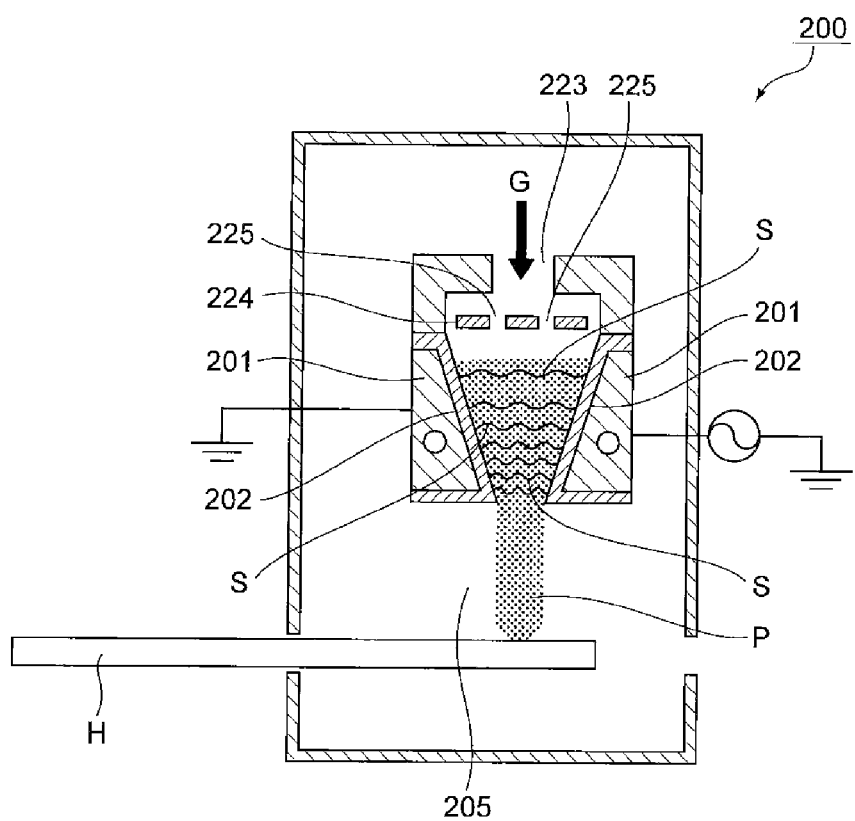
FIG. 18 is a perspective view schematically illustrating a conventional dielectric barrier plasma generator.

FIG. 17 is a cross-sectional view schematically illustrating a dielectric barrier plasma generator according to the sixth embodiment. As shown in FIG. 17, the plasma generator 100 is provided with a dielectric substrate 102, a high-voltage electrode 104 and a low-voltage electrode 110.

The dielectric substrate 102 has a flat portion 102*a* having a constant thickness and a staircase portion 102*b* formed from the flat portion 102*a* as a staircase shape and having a thickness being thinner in a staircase shape when being closer to the blowout outlet 30. Ceramics poses issues of being susceptible to cracking and lacking mechanical strength. Hence, this configuration of multiple steps including two steps or three steps can maintain the strength.

The low-voltage electrode 110 has a plate shape and is provided in the side facing the second surface 103b (the lower surface in FIG. 17) of the dielectric substrate 102. The low-voltage electrode 110 is formed with the groove 22 that is similar to that of the low-voltage electrode 20 according to the first embodiment. The groove 22 is formed with a staircase portion 123 having a thickness being thicker when being closer to the blowout outlet 30. As a result, the gas channel 25 includes a portion 124 in which a gap between the dielectric substrate 102 and the low-voltage electrode 110 becomes narrower when being closer to the blowout outlet 30. The sixth embodiment, which includes the portion in which the gap between the dielectric substrate 102 and the low-voltage electrode 110 becomes narrower when being closer to the blowout outlet 30, enables the amount of variation in capacitance to be further increased.

It is noted that the plasma generators 50, 60, 70, 80, and 100 according to the second embodiment to the sixth embodiment also have the similar effects as the plasma generator of the first embodiment 10, in addition to the effects described above.

Next, the plasma discharge starting method of the dielectric barrier plasma generator according to the present embodiment will be described. The plasma discharge starting method of the dielectric barrier plasma generator according to the present embodiment is used for the plasma generators 10, 50, 60, 70, 80, and 100. The plasma discharge starting method includes a process A in which at least one type of the starting gas selected from the group consisting of He, Ne, and Ar is introduced into the gas channel to generate plasma at the time of starting, and a process B in which a gas for generating plasma is introduced into the gas channel after the process A. In the plasma discharge starting method of the dielectric barrier plasma generator according to the present embodiment, at least one type of the starting gas selected from the group consisting of He, Ne, and Ar is introduced into the gas channel to generate plasma at the time of starting, and the gas for generating plasma (gas capable of generating desired active species) including hydrogen, oxygen, water, and nitrogen) is introduced into the gas channel after the starting time. This method enables discharge to start even when the gas for generating plasma is a gas that is less likely to undergo plasma discharge.

Although the embodiments of the present invention have been described above, the present invention is not limited to the examples described above; the present invention can be designed and modified as necessary within the scope of satisfying the configuration of the invention.

REFERENCE SIGNS LIST 10, 50, 60, 70, 80, 100 Dielectric barrier plasma generator (Plasma generator)
12, 52, 102 Dielectric substrate
12a, 52a, 102a Flat portion
12b, 52b Inclined portion
13a First surface
13b, 53b, 103b Second surface
14, 54, 104 High-voltage electrode
15 Clearance
20, 56, 110 Low-voltage electrode
22 Groove
23a, 23b Outer circumference
24 Gas introduction path
25 Gas channel
26 Gas buffer substrate
27 Cavity
30 Blowout outlet
34 Power introduction section
40 Gas delivery device
42 Power supply unit
56b Inclined portion (of low-voltage electrode)
64 Protective layer
72 Auxiliary starting member
82 Light-shielding member
83 Cavity
102b Staircase portion
123 Staircase portion

The invention claimed is:

1. The dielectric barrier plasma generator comprising:
a dielectric substrate having a first surface and a second surface;
a high-voltage electrode having a proximal end and a distal end and located on the first surface of the dielectric substrate;
a low-voltage electrode located to face the second surface of the dielectric substrate;
a power introduction section located near one of the ends of the high-voltage electrode;
a gas channel having a first end and a second end formed between the dielectric substrate and the low-voltage electrode in a direction from the first end to the second end to allow gas to flow from the first end of the gas channel to the second end while generating plasma thereof;
a blowout outlet formed at the second end of the gas channel to blow out the gas that has flown through the gas channel and the plasma that has been generated in the gas channel, wherein a thickness between the first surface and the second surface of the dielectric substrate becomes thinner over a predetermined narrowing portion the dielectric substrate as approaching closer to the blowout outlet; and
a clearance area located on the first surface of the dielectric substrate between the distal end of the high-voltage electrode and the blowout outlet for exposing the dielectric substrate.

2. The dielectric barrier plasma generator according to claim 1, further comprising a power supply unit having an applied voltage of 3 kV to 20 kV and a frequency of 20 kHz to 150 kHz.

3. The dielectric barrier plasma generator according to claim 1, wherein the gas channel includes a portion in which a gap between the dielectric substrate and the low-voltage electrode is narrower as being closer to the blowout outlet.

4. The dielectric barrier plasma generator according to claim 1, further comprising a protective layer in a vicinity of the blowout outlet and on the low-voltage electrode so as to prevent a material constituting the low-voltage electrode from dispersing.

5. The dielectric barrier plasma generator according to claim 1, wherein the dielectric substrate is made of a material including alumina or aluminum nitride.

6. The dielectric barrier plasma generator according to claim 1, wherein the high-voltage electrode includes a foil metal.

7. The dielectric barrier plasma generator according to claim 6, wherein the high-voltage electrode includes a sintered body containing conductive metal.

8. The dielectric barrier plasma generator according to claim 6, wherein the high-voltage electrode is formed by plating, vapor deposition, or sputtering.

9. The dielectric barrier plasma generator according to claim 1, further comprising an auxiliary starting member that is disposed in a vicinity of the blowout outlet and on the second surface of the dielectric substrate.

10. The dielectric barrier plasma generator according to claim 1, further comprising at least two gas introduction paths through which gas is introduced into the gas channel.

11. The dielectric barrier plasma generator according to claim 1, further comprising a light-shielding member at the blowout outlet.

12. The dielectric barrier plasma generator according to claim 1, further comprising a gas buffer substrate having a cavity thereinside, the gas buffer substrate being stacked on a surface of the low-voltage electrode, the surface being opposite to a surface facing the dielectric substrate.

13. The dielectric barrier plasma generator according to claim 1, wherein the portion of the dielectric substrate has the thickness being thinner when being closer to the blowout outlet and has a staircase shape.

14. The dielectric barrier plasma generator comprising:
a dielectric substrate having a first surface and a second surface;
a high-voltage electrode having a proximal end and a distal end and located on the first surface of the dielectric substrate;
a low-voltage electrode located to face the second surface of the dielectric substrate;
a power introduction section located near one of the ends of the high-voltage electrode;
a gas channel having a first end and a second end formed between the dielectric substrate and the low-voltage electrode in a direction from the first end to the second end to allow gas to flow from the first end of the gas channel to the second end while generating plasma thereof;
a blowout outlet formed at the second end of the gas channel to blow out the gas that has flown through the gas channel and the plasma that has been generated in the gas channel, wherein a thickness between the first surface and the second surface of the dielectric substrate over a becomes thinner predetermined narrowing portion of the dielectric substrate as approaching closer to the blowout outlet; and
a power supply unit having an applied voltage of 3 kV to 20 kV and a frequency of 20 kHz to 150 kHz to the high-voltage electrode so as to cause a dielectric barrier discharge between the high-voltage electrode and the low-voltage electrode through the dielectric substrate.

15. A plasma discharge starting method for a dielectric barrier plasma generator, providing:
a dielectric substrate having a first surface and a second surface;
a high-voltage electrode having a proximal end and a distal end and located on the first surface of the dielectric substrate;
a low-voltage electrode located to face the second surface of the dielectric substrate;
a power introduction section located near one of the ends of the high-voltage electrode;
a gas channel having a first end and a second end formed between the dielectric substrate and the low-voltage electrode in a direction from the first end to the second end to allow gas to flow from the first end of the gas channel to the second end while generating plasma thereof;
a blowout outlet formed at the second end of the gas channel to blow out the gas that has flown through the gas channel and the plasma that has been generated in the gas channel, wherein a thickness between the first surface and the second surface of the dielectric substrate becomes thinner over a predetermined narrowing portion of the dielectric substrate as approaching closer to the blowout outlet; and
a clearance area located on the first surface of the dielectric substrate between the distal end of the high-voltage electrode,
the plasma discharge starting method further comprising:
a process A of introducing at least one type of starting gas selected from the group consisting of He, Ne, and Ar into the gas channel to generate plasma at a time of starting;
a process B of introducing a gas for generating plasma into the gas channel after the process A; and
a process C of preventing direct discharge between the high-voltage electrode and the low-voltage electrode while enabling the discharge between the high-voltage electrode and the low-voltage electrode through the dielectric substrate, thereby preventing damage to the high-voltage electrode, dielectric substrate, and low-voltage electrode.

\* \* \* \* \*